(12) United States Patent
Carillo et al.

(10) Patent No.: US 12,527,131 B2
(45) Date of Patent: Jan. 13, 2026

(54) STRUCTURE, OPTOELECTRONIC DEVICE AND METHOD FOR PRODUCING A STRUCTURE

(71) Applicant: OSRAM Opto Semiconductors GmbH, Regensburg (DE)

(72) Inventors: Matthew J. Carillo, Portland, OR (US); Joseph A. Treadway, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 612 days.

(21) Appl. No.: 17/530,568

(22) Filed: Nov. 19, 2021

(65) Prior Publication Data

US 2023/0163253 A1 May 25, 2023

(51) Int. Cl.
  *H01L 33/50* (2010.01)
  *H10H 20/01* (2025.01)
  *H10H 20/851* (2025.01)
  *H10H 20/853* (2025.01)

(52) U.S. Cl.
  CPC ........ *H10H 20/8513* (2025.01); *H10H 20/01* (2025.01); *H10H 20/853* (2025.01); *H10H 20/0361* (2025.01); *H10H 20/0362* (2025.01)

(58) Field of Classification Search
  CPC ..... H01L 33/504; H01L 33/005; H01L 33/54; H01L 2933/0041; H01L 2933/005; H01L 33/501; H01L 33/502; C09K 11/565; C09K 11/883; C09K 11/02
  See application file for complete search history.

(56) References Cited

U.S. PATENT DOCUMENTS

2010/0167914 A1* 7/2010 Anderson ............... B01J 23/18
  977/773
2010/0283005 A1* 11/2010 Pickett ................... C09K 11/60
  252/301.4 P
(Continued)

FOREIGN PATENT DOCUMENTS

CN   112424268 A   2/2021
JP   2013505346 A  2/2013
(Continued)

OTHER PUBLICATIONS

Wang, Y., Song, S., Liu, J., Liu, D. and Zhang, H. (2015), ZnO-Functionalized Upconverting Nanotheranostic Agent: Multi-Modality Imaging-Guided Chemotherapy with On-Demand Drug Release Triggered by pHâ . Angew. Chem. Int. Ed., 54: 536-540. https://doi.org/10.1002/anie.201409519 (Year: 2015).*
(Continued)

*Primary Examiner* — Jarrett J Stark
(74) *Attorney, Agent, or Firm* — Viering, Jentschura & Partner mbB

(57) ABSTRACT

A structure, an optoelectronic device and a method for producing a structure are disclosed. In an embodiment, a structure comprises a first nanoparticle comprising at least one semiconductor material. The first nanoparticle is chromophoric in a first wavelength range and emissive in a second wavelength range. The structure further comprises a plurality of second nanoparticles. The second nanoparticles are non-chromophoric in the first wavelength range and in the second wavelength range.

10 Claims, 9 Drawing Sheets

(56) References Cited

U.S. PATENT DOCUMENTS

| | | | |
|---|---|---|---|
| 2011/0127445 A1* | 6/2011 | Zhang | A61K 41/0071 |
| | | | 977/773 |
| 2012/0282632 A1* | 11/2012 | Chiu | C09K 11/06 |
| | | | 525/186 |
| 2015/0179900 A1 | 6/2015 | Pickett et al. | |
| 2016/0020414 A1 | 1/2016 | Gu et al. | |
| 2017/0003293 A1* | 1/2017 | Chiu | G01N 33/587 |
| 2017/0373230 A1 | 12/2017 | Pickett et al. | |
| 2018/0072949 A1 | 3/2018 | Satake et al. | |
| 2019/0241805 A1 | 8/2019 | Ando | |
| 2020/0157420 A1 | 5/2020 | Hong et al. | |
| 2020/0287105 A1 | 9/2020 | Wyckoff et al. | |
| 2021/0139770 A1* | 5/2021 | Pousthomis | C09K 11/0883 |
| 2021/0269709 A1 | 9/2021 | Choi et al. | |
| 2023/0395736 A1* | 12/2023 | Fihri | H01L 31/055 |

FOREIGN PATENT DOCUMENTS

| | | | |
|---|---|---|---|
| JP | 2013505347 A | 2/2013 | |
| JP | 2020522746 A | 7/2020 | |
| JP | 2022522855 A | 4/2022 | |
| KR | 20180013129 A | 2/2018 | |
| KR | 20200023295 A | 3/2020 | |
| WO | 2016194351 A1 | 12/2016 | |

OTHER PUBLICATIONS

Fan Q, Cui X, Guo H, Xu Y, Zhang G, Peng B. Application of rare earth-doped nanoparticles in biological imaging and tumor treatment. Journal of Biomaterials Applications. 2020;35(2):237-263. doi: 10.1177/0885328220924540 (Year: 2020).*

Lining Sun, Ruoyan Wei, Jing Feng, Hongjie Zhang, Tailored lanthanide-doped upconversion nanoparticles and their promising bioapplication prospects, Coordination Chemistry Reviews, vol. 364,2018, pp. 10-32, ISSN 0010-8545, (Year 2018).*

International Search Report issued for the corresponding International patent application No. PCT/EP2022/081456, dated Mar. 7, 2023, 13 pages (for informational purposes only).

Korean office action issued for the corresponding Korean patent application No. 10-2024-7020056, dated May 26, 2025, 8 pages (for informational purposes only).

Japanese office action issued for the corresponding Japanese patent application No. 2024-528565, dated Jun. 10, 2025, 6 pages (for informational purposes only).

Search Report by Registered Search Organization issued for the corresponding JP patent application No. JP 2024528565, dated May 8, 2025, 25 pages (For informational purposes only).

* cited by examiner

STRUCTURE, OPTOELECTRONIC DEVICE AND METHOD FOR PRODUCING A STRUCTURE

TECHNICAL FIELD

A structure, an optoelectronic device and a method for producing a structure are disclosed.

BACKGROUND

It is desirable to have a structure with an improved performance. It is desirable to have an optoelectronic device comprising a structure with an improved performance. It is desirable to have a method for producing a structure with an improved performance.

SUMMARY

According to at least one embodiment, a structure is provided. The structure may comprise different elements, components, or parts with specific, in particular different, properties.

According to at least one embodiment, the structure comprises a first nanoparticle comprising or consisting of at least one semiconductor material. For example, the first nanoparticle comprises or consists of a material based on III-V compound semiconductor materials or II-VI compound semiconductor materials.

In particular, the structure comprises exactly one first nanoparticle or exactly two first nanoparticles or a plurality of first nanoparticles, for example, ten or more first nanoparticles.

According to at least one embodiment, the first nanoparticle is chromophoric in a first wavelength range and emissive in a second wavelength range. Here and in the following, chromophoric means that the first nanoparticle is electronically excitable in a specific wavelength range. In other words, the first nanoparticle is configured or designed to absorb electromagnetic radiation with a wavelength in the first wavelength range, in particular by exciting an electron from a ground state into an excited state. Here and in the following, emissive means that the first nanoparticle emits radiation in a specific wavelength range. In other words, the first nanoparticle is configured or designed to emit electromagnetic radiation with a wavelength in the second wavelength range, in particular by returning an excited electron from an excited state into a ground state.

In particular, the first nanoparticle comprises wavelength converting properties. In other words, the first nanoparticle has the ability to absorb electromagnetic radiation in the first wavelength range and to emit electromagnetic radiation in the second wavelength range. In a further embodiment, the second wavelength range is at least partially different from the first wavelength range. For example, the first nanoparticle is chromophoric in a first wavelength range between and including 400 nm and 490 nm, such as at 450 nm. For example, the first nanoparticle is emissive in a second wavelength range between and including 500 nm and 2000 nm, such as between and including 500 nm and 700 nm.

According to at least one embodiment, the structure comprises a plurality of second nanoparticles. In other words, the structure comprises two or more second nanoparticles, for example, ten or more second nanoparticles. Each second nanoparticle of the plurality of second nanoparticles may be identical, similar, or different compared to any other second nanoparticle in at least one of: size, composition, and shape. In particular, the plurality of second nanoparticles may comprise different types of second nanoparticles with the different types of second nanoparticles, for example, having a different composition.

It should be noted that the number of second nanoparticles in the structure may be dependent on their size compared to the size of the first nanoparticle. The smaller the second nanoparticles are compared to the first nanoparticle, the more second nanoparticles need to be present in the structure. When the second nanoparticles are as big as or larger than the first nanoparticle, approximately the same amount of second nanoparticles compared to the first nanoparticles may be present in the structure.

According to at least one embodiment, the second nanoparticles are non-chromophoric in the first wavelength range and in the second wavelength range. Here and in the following, non-chromophoric means that the second nanoparticles are not electronically excitable in a specific wavelength range. Thus, the second nanoparticles absorb significantly less electromagnetic radiation in both the first wavelength range and the second wavelength range as compared to a particle that is chromophoric in at least one of said wavelength ranges. In other words, the second nanoparticles absorb significantly less electromagnetic radiation in both the excitation wavelength range and the emission wavelength range of the first nanoparticle.

As defined herein, "absorbs significantly less electromagnetic radiation" means that the second nanoparticles absorb less of the energy of the electromagnetic radiation in the first and the second wavelength range as compared to a particle that is chromophoric in at least one of said wavelength ranges. In particular, the second nanoparticles absorbs at least 50%, at least 60%, at least 70%, at least 80%, or at least 90% less energy of the electromagnetic radiation as compared to a chromophoric particle.

It should be noted that the second nanoparticles may be chromophoric in a wavelength range that is different from the first wavelength range and the second wavelength range. For example, the second nanoparticles are chromophoric in an ultraviolet (UV) wavelength range, such as 250 nm to 400 nm, without being emissive, but are non-chromophoric in a first wavelength range between and including 400 nm and 490 nm and in a second wavelength range between and including 500 nm and 2000 nm.

In particular, the second nanoparticles are configured or designed to have an equal or greater affinity for a degrading species, for example, by displaying a chemical reactivity towards the degrading species, which is likely to degrade a first nanoparticle. In other words, the non-chromophoric material of the second nanoparticles may intercept a degrading species which otherwise would lead to the degradation of the outermost surface of the first nanoparticle. The degrading species is, for example but not limited to, oxygen, water, high temperature, and combinations thereof. In the presence of the degrading species, the second nanoparticles may consume the degrading species through chemical reaction prior to the degrading species reacting with the first nanoparticle. Thus, the second nanoparticles may act as a protection screen between the first nanoparticle and the degrading species. Alternatively, the material of the second nanoparticle may display physical affinity towards the species likely to degrade the first nanoparticle, for example but not limited to, water, and adsorb that degrading species before it can reach the surface of the first nanoparticle.

For example, the second nanoparticles stabilize the degradation of the outermost shell of a first nanoparticle, such as a multi-shell quantum dot, through one or more of the following mechanisms. The second nanoparticles may prevent or slow dissolution of the outermost shell by providing a constant level of dissolved ions of the same species as the outermost shell near the first nanoparticle. Further, the second nanoparticles may also provide a source of a monomer of the outermost shell to re-deposit shell material upon partially corroded first nanoparticles. Further, the second nanoparticles may also provide a repository for damaging redox equivalents photo-generated during the material aging such as photo-oxidation via Auger processes. Further, the second nanoparticles may trap superoxide, hydroxy radicals, and other reactive oxygen species.

According to at least one embodiment, the structure comprises a first nanoparticle comprising at least one semiconductor material. The first nanoparticle is chromophoric in a first wavelength range and emissive in a second wavelength range. The structure further comprises a plurality of second nanoparticles. The second nanoparticles are non-chromophoric in the first wavelength range and in the second wavelength range.

In the structure described here, the second nanoparticles provide a barrier to the degradation of the first nanoparticle by having an equal or greater affinity for degrading species likely to degrade the first nanoparticle. The second nanoparticles intercept the degrading species by chemically reacting with or absorbing the degrading species and thus stabilize the first nanoparticle in environmentally challenging conditions, such as high humidity and high temperature.

According to at least one embodiment, the first nanoparticle comprises a core and at least one shell. The core and/or the shell comprise at least one semiconductor material. In a further embodiment, the core comprises a different semiconductor material than the shell. In particular, the at least one shell is grown epitaxially on the core. In addition, the first nanoparticle may comprise further shells and/or layers. For example, the first nanoparticle is a quantum dot, in particular a core-shell quantum dot.

According to at least one embodiment, the first nanoparticle comprises a core-shell-shell structure. For example, the first nanoparticle is a CdSe/CdS/ZnS photoluminescent quantum dot.

According to at least one embodiment, the first nanoparticle comprises a diameter between and including 20 nm and 50 nm.

According to at least one embodiment, the second nanoparticles comprise a diameter between and including 2 nm and 50 nm. In particular, the second nanoparticles are smaller or comparable to the first nanoparticle in size. In other words, the second nanoparticles are within the same order of magnitude compared to the first nanoparticle.

According to at least one embodiment, the second nanoparticles are at least one of metallo-particles, semiconductor particles, chalcogenide particles, pnictide particles, and combinations thereof. In particular, the second nanoparticles comprise or consist of Zn-containing particles.

Metallo-particles comprise or consist of a metal, such as the transition metals in the d-block of the periodic table.

Semiconductor particles comprise or consists of a semiconductor material, such as II-VI semiconductors or III-V semiconductors.

Chalcogenide particles comprise or consist of a chalcogenide. A chalcogenide is a chemical compound consisting of at least one chalcogen anion of the group 16 elements of the periodic table and at least one or more electropositive elements, such as a metal. For example, a chalcogenide is an oxide, a sulfide, a selenide, a telluride, and/or a polonide.

For example, a chalcogenide particle comprises or consists of zinc oxide, in particular nano-ZnO. Second nanoparticles formed from ZnO may have a different band structure than the outermost shell of the first nanoparticle which in particular contains a related material such as ZnS. The differences in band structure result in differences in redox potential. Second nanoparticles with a different band structure and resulting differences in redox potential than the outermost shell of the first nanoparticle are particularly advantageous for providing a repository for damaging redox equivalents and trapping reactive oxygen species in the vicinity of the first nanoparticle.

Alternatively or additionally, a chalcogenide particle comprises or consists of zinc sulfide, in particular nano-ZnS. Second nanoparticles formed from ZnS are particularly advantageous for first nanoparticles comprising an outermost shell of ZnS. In addition to providing a repository for damaging redox equivalents and trapping reactive oxygen species, second nanoparticles of ZnS may provide a constant level of dissolved ZnS in the form of $Zn^{2+}$ and $S^{2-}$ ions near the first nanoparticle for slowing dissolution of the outermost shell of the first nanoparticle. Further, the second nanoparticles of ZnS may provide a source of ZnS monomer to redeposit upon a partially corroded first nanoparticle.

Pnictide particles comprise or consists of a pnictide. A pnictide is a chemical compound consisting of at least one pnictogen anion of the group 15 elements of the periodic table and at least one or more electropositive elements, such as a metal. For example, a pnictide is a nitride, a phosphide, an arsenide, an antimonide, and/or a bismuthide.

According to at least one embodiment, the first nanoparticle and the second nanoparticles are arranged in close proximity within the structure. In other words, the first nanoparticle and the second nanoparticles are arranged very near or close to one another. In particular, the first nanoparticle and the second nanoparticles are less than 30 µm away from one another. For example, the distance between the first nanoparticle and the second nanoparticles is between and including 0 µm and 30 µm. In other words, the first nanoparticle and the second nanoparticles may be arranged in direct contact or may be spaced apart up to 30 µm. Second nanoparticles arranged in close proximity to the first nanoparticle provide a barrier against degrading species and enhance the stability of the first nanoparticle.

According to at least one embodiment the first nanoparticle and the second nanoparticles are co-located within the structure. In other words, the first nanoparticle and the second nanoparticles are arranged in such a way that they are in the same place or close together, for example, in the same location. In particular, co-located nanoparticles have a distance between them between and including 0 µm and 30 µm. A co-location of the first nanoparticle and the second nanoparticles provides an enhanced stability of the structure, in particular of the first nanoparticle, against degrading species.

According to at least one embodiment, the structure further comprises an encapsulation. In particular, the encapsulation is provided to protect the first nanoparticle and/or the second nanoparticles from degradation. The encapsulation may surround the first nanoparticle and/or the second nanoparticles at least partially, or completely. The first nanoparticle and/or the second nanoparticles may be surrounded by the encapsulation from all sides. In particular, the first nanoparticle and/or the second nanoparticles may be in direct contact with the encapsulation material.

According to at least one embodiment, the encapsulation comprises a material comprising or consisting of metal oxides and mixtures thereof. For example, the encapsulation material comprises or consists of silica.

According to at least one embodiment, the first nanoparticle and the second nanoparticles are co-encapsulated in the encapsulation. Co-encapsulated nanoparticles are co-located or co-entrapped in the encapsulation material in such a way that the encapsulation material surrounds both the first nanoparticle and the second nanoparticles at least partially, or completely. In other words, the encapsulation forms a layer around both the first nanoparticle and the second nanoparticles at least partially, or completely. In particular, the second nanoparticles are entrapped in the encapsulation material in close proximity to the first nanoparticle such that the first nanoparticle and the second nanoparticles may move together within the encapsulation. In particular, a structure comprising co-encapsulated nanoparticles exhibits different properties than a structure comprising a first nanoparticle encapsulated in an encapsulation material that is subsequently treated with a chemical compound. Further, the nanoscale size of the second nanoparticles may provide a means to entrap the second nanoparticles in the same vicinity as the first nanoparticle. This may contrast with ions or small molecules which may more or less freely diffuse through the encapsulation material such as silica.

According to at least one embodiment, the first nanoparticle and the second nanoparticles are spaced apart within the encapsulation. In particular, the first nanoparticle has no direct contact with any of the second nanoparticles. The distance between the first nanoparticle and the second nanoparticles within the encapsulation is at most 30 µm. This mere proximity of second nanoparticles to the first nanoparticle is sufficient to create a preservative effect in the structure without the first nanoparticle and the second nanoparticles being in direct physical contact.

According to at least one embodiment, each second nanoparticle is in direct contact with at least one of the first nanoparticle and a further second nanoparticle of the plurality of second nanoparticles. The first nanoparticle and the second nanoparticles are in such close proximity that the surfaces of the first nanoparticle and the second nanoparticles are touching. In other words, the first nanoparticle and the second nanoparticles form an assembly. In particular, the assembly may be formed by an electrostatic attraction between the first nanoparticle and the second nanoparticles, or the assembly may be formed by applying heat to the first nanoparticle and the second nanoparticles. In particular, the first nanoparticle and the second nanoparticles are in electronic contact with one another. Second nanoparticles in direct contact with the first nanoparticle may increase the preservative effect of the second nanoparticles in the structure.

According to at least one embodiment, the second nanoparticles are bonded to the first nanoparticle by at least one method, such as aggregating, non-covalent binding, covalent binding, melting, sintering, agglomerating, and combinations thereof. In particular, the second nanoparticles are bonded to the first nanoparticle prior to encapsulating the first nanoparticle and/or the second nanoparticles in an encapsulation material. In this instance, the first nanoparticle and the second nanoparticles form a pre-assembly prior to encapsulation.

As described herein, aggregating the first nanoparticle and the second nanoparticles means bringing together the first nanoparticle and the second nanoparticles in such a way that the first nanoparticle and the second nanoparticles form an aggregate. An aggregate may be formed by a collection of the first nanoparticle and the second nanoparticles, for example, in the form of a cluster. In particular, aggregating does not necessarily mean that the first nanoparticle and the second nanoparticles are brought together in a stoichiometric way.

As described herein, non-covalent binding of the first nanoparticle and the second nanoparticles means that a physical and/or chemical interaction between the first nanoparticle and the second nanoparticles takes place that results in a non-covalent bond between the first nanoparticle and the second nanoparticles. Non-covalent binding may encompass any bond that is non-covalent such as dative bonds, ionic bonds, hydrogen bonds, dipole-dipole interactions, intercalation, and van der Waals interactions.

For example, the first nanoparticle and the second nanoparticles may be prepared in such a way that the two nanoparticle types are oppositely charged. The oppositely charged nanoparticles may aggregate into hetero-structures. In particular, the first nanoparticle and/or the second nanoparticles may comprise bound and charged ligands on the surface, such as organic ligands. The organic ligands may be either positively or negatively charged. Alternatively, the first nanoparticle may comprise an encapsulation surrounding the first nanoparticle that is naturally negatively charged. In this instance, the negatively charged first nanoparticle may be brought together with positively charged second nanoparticles for non-covalent binding based on ionic bonds.

Alternatively, the first nanoparticle and the second nanoparticles may comprise ligands with long hydrophobic chains such that the first nanoparticle and the second nanoparticles may non-covalently bind by intercalating the hydrophobic ligands.

As described herein, covalent binding of the first nanoparticle and the second nanoparticles means that a covalent bond is formed between the first nanoparticle and/or the second nanoparticles. In particular, covalent bonds are formed between ligands of the first nanoparticle and/or the second nanoparticles. Covalent bonds between the first nanoparticle and/or the second nanoparticles may be formed by any chemical reaction that links together two ligands, for example, photo-reaction chemistry, peptide chemistry, methacrylate chemistry, polyester chemistry, or the like. For example, ether or ester connections as well as carbon-carbon, silicon-carbon, sulfur-carbon, phosphorus-carbon, or nitrogen-carbon bonds may be used to link together the ligands of the first nanoparticle and/or the second nanoparticles.

As described herein, bonding the second nanoparticles to the first nanoparticle by melting means that second nanoparticles in close proximity to the first nanoparticle are at least partially melted such that the second nanoparticles are bonded to a surface of the first nanoparticle as an at least partially melted structure. In particular, the structural integrity of the first nanoparticle is not corrupted by bonding the second nanoparticles to the first nanoparticle by melting.

As described herein, sintering the first nanoparticle and the second nanoparticles means that the first nanoparticle and the second nanoparticles are compacted and form a solid mass of material by heat or pressure without melting the first nanoparticle and/or the second nanoparticles to the point of liquefaction. The second nanoparticles may form a sintered structure on the surface of the first nanoparticle. In particular, the structural integrity of the first nanoparticle is not corrupted by bonding the second nanoparticles to the first nanoparticles by sintering.

In particular, the first nanoparticle and the second nanoparticles are sintered or at least partially melted by applying a temperature of between and including 90° C. and 400° C.

In particular, by bonding the second nanoparticles to the first nanoparticle by melting or sintering, no organic mediators are present in the structure, in particular between the first nanoparticle and the second nanoparticles. In other words, the structure is free of organic mediators.

As described herein, agglomerating is to be understood as associating the first nanoparticle and the second nanoparticles. In other words, the first nanoparticle and the second nanoparticles form an agglomerate. In an agglomerate, the spatial forms of the first nanoparticle and the second nanoparticles may be recognized. Thus, the spatial forms of the first nanoparticle and the second nanoparticles remain intact after agglomeration.

According to at least one embodiment, a surface of the first nanoparticle is partially covered by the second nanoparticles. The first nanoparticle may be at least partially surrounded by second nanoparticles. In other words, the surface of the first nanoparticle is decorated with second nanoparticles at least in places. In particular, the surface of the first nanoparticle is in direct contact to second nanoparticles at least in places.

According to at least one embodiment, a surface of the first nanoparticle is completely covered by the second nanoparticles. The first nanoparticle is surrounded by second nanoparticles in such a way that the full extent of the surface of the first nanoparticle is decorated with second nanoparticles.

According to at least one embodiment, the second nanoparticles form a layer around the first nanoparticle. The layer of second nanoparticles may surround the first nanoparticle at least partially, or completely. The layer of second nanoparticles may comprise the aggregated, agglomerated, covalently bonded, or non-covalently bonded second nanoparticles. In this instance, the shape of each individual second nanoparticle remains distinguishable. Alternatively, the layer of second nanoparticles may comprise a melted and/or sintered structure.

In particular, a surface of the layer of second nanoparticles around the first nanoparticle comprises a roughness. In particular, the roughness of the layer of second nanoparticles is increased compared to a roughness of the surface of the first nanoparticle.

In particular, the surface of the layer of second nanoparticles around the first nanoparticle comprises a surface area that is increased compared to a surface area or a roughness of the surface of the first nanoparticle. An increased surface area is advantageous for accelerating surface reactions.

According to at least one embodiment, the layer of second nanoparticles comprise a thickness between and including 1 nm and 100 nm, in particular between and including 1 nm and 20 nm, or between and including 1 nm and 10 nm. The layer of second nanoparticles may comprise one monolayer of second nanoparticles or more than one monolayer of second nanoparticles.

According to at least one embodiment, the second nanoparticles comprise at least one surface moiety. The surface moiety may be organic or inorganic. The surface moiety may be configured or designed for bearing an affinity for the species likely to degrade the first nanoparticle. In particular, the at least one surface moiety is directly or indirectly bonded to a surface of the second nanoparticles. For example, the surface moiety is poly-ethyleneglycol. Poly-ethyleneglycol decorated second nanoparticles may, through their affinity for water, enhance the moisture of the environment near the first nanoparticle which may be helpful against photo-degradation of the first nanoparticle. Another class of surface moiety includes at least one of reductants and oxidants such as boranes, borohydrides, citrates, oxalates, reducing sugars, aldehydes, or hydrazine iodide, sulfites, thiosulfates, and dithionates.

According to at least one embodiment, the second nanoparticles comprising at least one surface moiety are inactive. In this case, the second nanoparticles may be utilized more for their surface moiety carrying capacities. In other words, the second nanoparticles have no interaction with the species likely to degrade the first nanoparticle and thus do not bear an affinity for such species. For example, inactive second nanoparticles are silica nanoparticles or polymeric nanoparticles.

According to at least one embodiment, the second nanoparticles comprising at least one surface moiety are active. In other words, the second nanoparticles as well as the surface moiety have an interaction with the species likely to degrade the first nanoparticle. Thus, both the second nanoparticles and the surface moieties are beneficial for the protection of the first nanoparticle. For example, active second nanoparticles are second nanoparticles configured or designed to have an equal or greater affinity for a degrading species which are likely to degrade a first nanoparticle, such as ZnS or ZnO nanoparticles.

According to at least one embodiment, the at least one surface moiety is diffused in an encapsulation material surrounding the second nanoparticles and the first nanoparticle. In other words, the surface moiety may be bonded to the second nanoparticles prior to encapsulation and may diffuse into the encapsulation material during or after encapsulation. In particular, the surface moiety is then no longer in direct contact to the second nanoparticles during or after encapsulation.

According to at least one embodiment, the second nanoparticles comprise two surface moieties, wherein the first surface moiety is bonded to the second nanoparticles by a second surface moiety. The second surface moiety may be bonded to a surface of the second nanoparticles by non-covalent or covalent bonds. The second surface moiety may be a polymer or a molecular species with an affinity for the first surface moiety. The first surface moiety may be attached to the second nanoparticles by forming a non-covalent or covalent bond with the second surface moiety. This is particularly advantageous for first surface moieties that have little or no affinity for binding to the surface of the second nanoparticles.

According to at least one embodiment, the structure comprises at least one internal payload species in close proximity to the first nanoparticle. An internal payload species comprises, for example, ions, such as copper(I), iron(II) and mercury. The internal payload species in close proximity to the first nanoparticle is configured or designed to have an equal or greater affinity for a degrading species likely to degrade a first nanoparticle.

According to at least one embodiment, the at least one internal payload species is internal to the second nanoparticle. In other words, the internal payload species is not attached to the surface of the second nanoparticle, but substitutionally or interstitially incorporated into a lattice of the second nanoparticle. The second nanoparticle may act as a buffer that provides a stream of ions of the internal payload species in the vicinity of the first nanoparticle. It should be noted that the internal payload species provides its effect when released in proximity to the first nanoparticle and not when bonded on and/or in the second nanoparticle. In particular, the second nanoparticle functions as a carrier for bringing the internal payload species in the vicinity of the first nanoparticle functioning as a slow release drug.

According to at least one embodiment, at least one of the second nanoparticles comprises a first internal payload species and at least one of the second nanoparticles comprises a second internal payload species. In particular, the first internal payload species and the second internal payload species differ from one another in at least one of: composition and charge number. In this context, composition is to be understood as including one or more elements, in particular one metallic element. Two different internal payload species in close proximity to the first nanoparticle may increase the advantageous effect of the internal payload species on the protection against degradation.

According to at least one embodiment, the first nanoparticle is encapsulated in a first encapsulation, the second nanoparticles are encapsulated in a second encapsulation, and the first encapsulation and the second encapsulation are in direct contact with each other. In other words, an encapsulated first nanoparticle and encapsulated second nanoparticles form an agglomerate or an aggregate or are fused such that the encapsulated nanoparticles are in close proximity to one another. Thus, the structure may be an assembly of pre-encapsulated nanoparticles. In particular, the first nanoparticle is encapsulated individually, wherein a plurality of second nanoparticles may be encapsulated together in one encapsulation or, alternatively, each second nanoparticle may be encapsulated individually. In particular, at least one of the first encapsulation and the second encapsulation comprises or consists of an encapsulation material selected from the group consisting of metal oxides and mixtures thereof. In particular, the first nanoparticle and/or the second nanoparticles are homogeneously encapsulated.

According to at least one embodiment, the first encapsulation and the second encapsulation comprise the same encapsulation material. In particular, the encapsulation material of the first encapsulation and of the second encapsulation is selected from the group consisting of metal oxides and mixtures thereof. For example, the encapsulation material of the first encapsulation and of the second encapsulation is silica.

Another embodiment relates to an optoelectronic device. In a further embodiment, the optoelectronic device described here comprises at least one structure described above. Features and embodiments of the optoelectronic device are therefore also disclosed for the structure and vice versa.

According to at least one embodiment, the optoelectronic device comprises a semiconductor chip configured to emit a primary radiation, and a conversion element configured to convert at least a portion of the primary radiation into secondary radiation. The conversion element comprises at least one structure described above.

The semiconductor chip may comprise an active layer stack comprising an active region that emits the primary radiation during operation of the device. The semiconductor chip is, for example, a light-emitting diode chip or a laser diode chip. The primary radiation generated in the semiconductor chip may be emitted through a radiation emission surface of the semiconductor chip. In particular, the semiconductor chip emits a primary radiation in the visible wavelength range during operation, such as wavelengths greater than 400 nm. For example, the semiconductor chip emits the primary radiation in the wavelength range between and including 400 nm and 490 nm, such as 450 nm.

The structures in the conversion element are configured to convert the primary radiation at least partially or completely into a secondary radiation. In particular, the secondary radiation has a wavelength range that is at least partially, or completely, different from the wavelength range of the primary radiation. For example, the wavelength range of the secondary radiation is in the visible or IR wavelength range, for example, in a wavelength range between and including 500 nm and 2000 nm.

The features of the structure have already been disclosed in conjunction with the structure and also apply to the structures in the optoelectronic device.

Such an optoelectronic device may be used for emitting white light or colored light. The structures in the conversion element have an enhanced stability in environmentally challenging conditions such as high humidity and high temperature due to the co-location of non-chromophoric second nanoparticles and a chromophoric and emissive first nanoparticle. Thus, the optoelectronic device described here has an increased operating lifetime under corrosive conditions.

Another embodiment relates to a method for producing a structure. The method described here may be used to produce the structure described above which may be used in the optoelectronic device described above. Features and embodiments of the method are therefore also disclosed for the structure and the optoelectronic device and vice versa.

According to at least one embodiment, the method for producing a structure comprises providing a first nanoparticle comprising at least one semiconductor material. The first nanoparticle is chromophoric in a first wavelength range and emissive in a second wavelength range. The method further comprises providing a plurality of second nanoparticles. The second nanoparticles are non-chromophoric in the first wavelength range and in the second wavelength range. The method further comprises arranging the first nanoparticle and the second nanoparticles in close proximity.

The method steps for producing a structure described here are not restricted to this order. According to a further embodiment, however, they are carried out in this order.

With such a method, a structure may be produced in which the first nanoparticle is protected against degrading species by the close proximity of the first nanoparticle to the second nanoparticles having an equal or greater affinity for degrading species likely to degrade the first nanoparticle.

According to at least one embodiment, the method further comprises bonding the second nanoparticles to the first nanoparticle by at least one method, such as aggregating, non-covalent binding, covalent binding, melting, sintering, agglomerating, and combinations thereof. In particular, the second nanoparticles cover the surface of the first nanoparticle at least partially, or completely. The second nanoparticles may form a layer around the first nanoparticle, for example, by a method, such as aggregating, non-covalent binding, covalent binding, agglomerating, or combinations thereof. Alternatively, the second nanoparticles may form a layer comprising a melted or sintered structure of the second nanoparticles around the first nanoparticle.

According to at least one embodiment, the method further comprises applying an encapsulation. The encapsulation may be applied before, during or after arranging the first nanoparticle and the second nanoparticles in close proximity. For example, the first nanoparticle and/or the second nanoparticles are being encapsulated prior to arranging the nanoparticles in close proximity. Alternatively, the first nanoparticle and the second nanoparticles are encapsulated together and are thus arranged in close proximity during encapsulation. In this instance, the first nanoparticle and the second nanoparticles are co-encapsulated. In particular, this may include admixing the first nanoparticle and the second nanoparticles prior to forming the encapsulation around the nanoparticles. Such a method may be sufficient to provide a statistically distributed random co-encapsulation of the first nanoparticle with the second nanoparticles. Alternatively, the first nanoparticle and the second nanoparticles may be arranged in close proximity, i.e. pre-assembled, for example, by bonding the second nanoparticles to the surface of the first nanoparticle, prior to encapsulation.

According to at least one embodiment, the method further comprises encapsulating the first nanoparticle in a first encapsulation, encapsulating the second nanoparticles in a second encapsulation, and arranging the first encapsulation and the second encapsulation in direct contact. In other words, both the first nanoparticle and the second nanoparticles are encapsulated prior to arranging the first nanoparticle and the second nanoparticles in close proximity.

BRIEF DESCRIPTION OF THE DRAWINGS

Advantageous embodiments and developments of the structure, the optoelectronic device, and the method for producing a structure will become apparent from the exemplary embodiments described below in conjunction with the figures.

In the figures.

In the exemplary embodiments and figures, similar or similarly acting constituent parts are provided with the same reference symbols. The elements illustrated in the figures and their size relationships among one another should not be regarded as being true to scale. Rather, individual elements may be represented with an exaggerated size for the sake of better representability and/or for the sake of better understanding.

DETAILED DESCRIPTION

Figure 1:
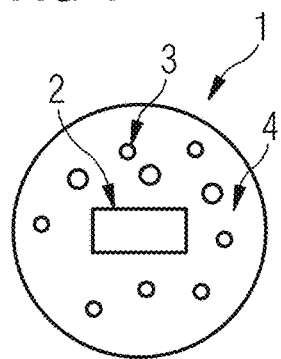
FIGS. 1, 4A, 4B, 6, 8, 10, and 12 each show a schematic illustration of a structure according to different exemplary embodiments, FIGS. 2, 5A-C, 7A, 7B, 9, 11, and 13 each show a schematic illustration of a method for producing a structure according to different exemplary embodiments.

FIG. 1 shows a schematic illustration of a structure 1. The structure 1 comprises a first nanoparticle 2. The first nanoparticle 2 comprises at least one semiconductor material. For example, the first nanoparticle is a photoluminescent quantum dot such as a CdSe/CdS/ZnS core-shell-shell quantum dot. The first nanoparticle 2 is chromophoric in a first wavelength range and emissive in a second wavelength range. In other words, the first nanoparticle 2 may absorb electromagnetic radiation of the first wavelength range and emit electromagnetic radiation in the second wavelength range. For example, the first wavelength range comprises wavelengths between and including 400 nm and 490 nm and the second wavelength range comprises wavelengths between and including 500 nm and 2000 nm, in particular between and including 500 nm and 700 nm.

The structure further comprises a plurality of second nanoparticles 3. The second nanoparticles 3 are non-chromophoric in the first wavelength range and in the second wavelength range. In other words, the second nanoparticles 3 neither absorb wavelengths in the first wavelength range nor in the second wavelength range. Alternatively, the second nanoparticles 3 absorb significantly less electromagnetic radiation in both the first and the second wavelength range than a particle that is chromophoric in said wavelength ranges. For example, the second nanoparticles 3 are metalloparticles, semiconductor particles, such as II-VI semiconductors, chalcogenide particles, such as nano-ZnS or nano-ZnO, pnictide particles, and combinations thereof. The second nanoparticles 3 are co-located with the first nanoparticle 2 within the structure 1 meaning that the second nanoparticles 3 are arranged in close proximity to the first nanoparticle 2. In particular, a distance between the first nanoparticle 2 and the second nanoparticles 3 is between and including 0 µm and 30 µm. The second nanoparticles 3 have an equal or greater affinity for degrading species likely to degrade the first nanoparticle 2 by intercepting and chemically reacting with and/or absorbing the degrading species.

Optionally, the structure 1 may comprise an encapsulation 4 at least partially, or completely, surrounding the first nanoparticle 2 and the second nanoparticles 3. In this instance, the first nanoparticle 2 and the second nanoparticles 3 may be co-encapsulated in the encapsulation 4. The encapsulation 4 may comprise or consist of an encapsulation material comprising or consisting of metal oxides such as silica.

Figure 2:
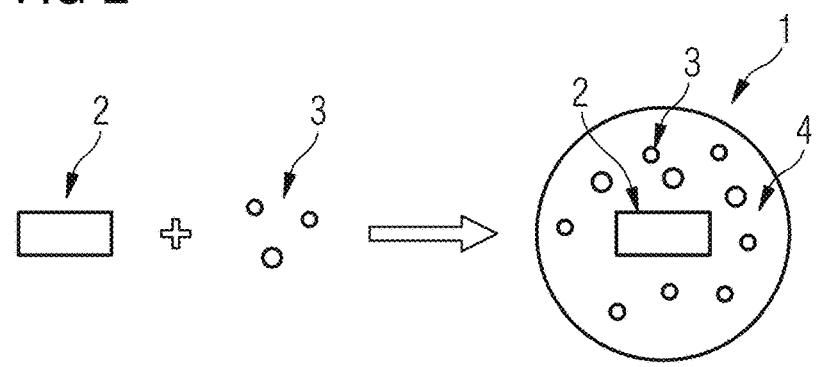

The structure 1 according to FIG. 1 may be produced according to FIG. 2 by admixing the first nanoparticle 2 and the second nanoparticles 3 prior to forming an encapsulation 4 around the nanoparticles. This is sufficient to provide a statistically distributed random co-encapsulation of second nanoparticles 3 and the first nanoparticle 2.

In a further embodiment of the structure 1 according to FIG. 1, the first nanoparticle 2 is a CdSe/CdS/ZnS photoluminescent quantum dot and the second nanoparticles 3 are nano-ZnS particles. Optionally, the first nanoparticle 2 and the second nanoparticles 3 are co-encapsulated in an encapsulation 4 of silica. In this case, the nano-ZnS stabilizes the degradation of the ZnS layer of the multi-shell quantum dot through one or more of several mechanisms. The nano-ZnS may provide a constant level of dissolved ZnS ($Zn^{2+}$ and $S^{2-}$) near the quantum dot slowing dissolution. The nano-ZnS may also provide a repository for damaging redox equivalents photo-generated during the material aging, for example, photo-oxidation via Auger processes. The nano-ZnS may trap superoxide, hydroxy radicals, and other reactive oxygen species. The nano-ZnS may further provide a source of ZnS monomer to redeposit upon the partial corroded quantum dot.

Figure 3:
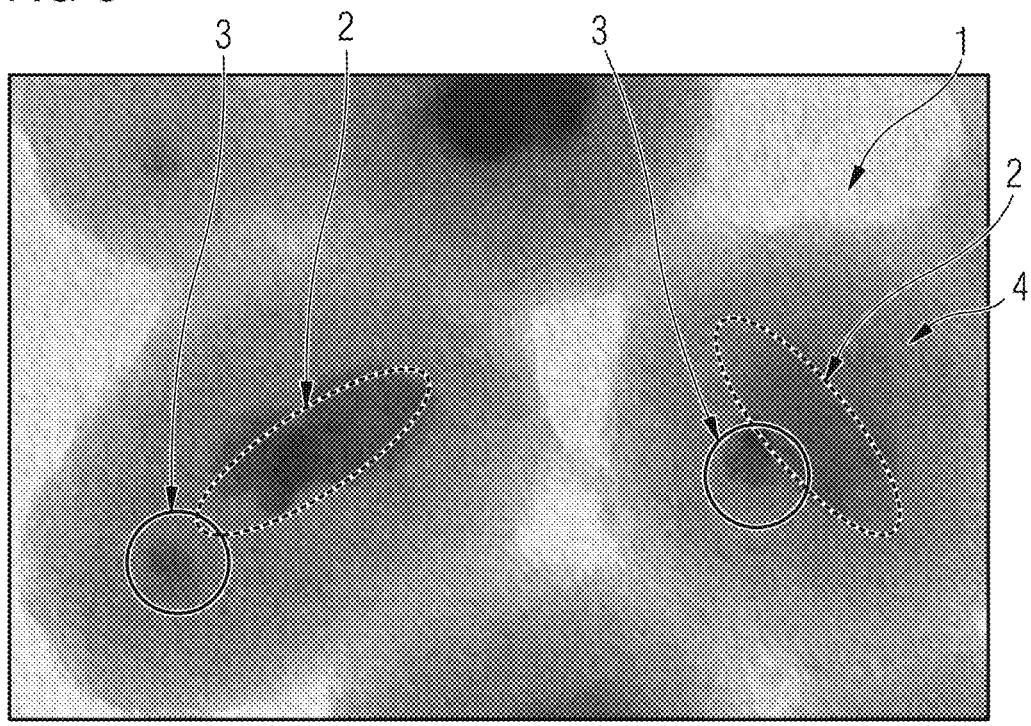
FIG. 3 shows a transmission electron microscopy (TEM) micrograph of a structure according to an exemplary embodiment.

FIG. 3 shows a TEM micrograph of a structure 1 comprising a CdSe/CdS/ZnS first nanoparticle 2 co-encapsulated in a silica encapsulation 4 with nano-ZnS second nanoparticles 3. The mere proximity of the nano-ZnS second nanoparticles 3 is sufficient to create a preservative effect in the composite system of the CdSe/CdS/ZnS first nanoparticle 2.

Figure 4A:
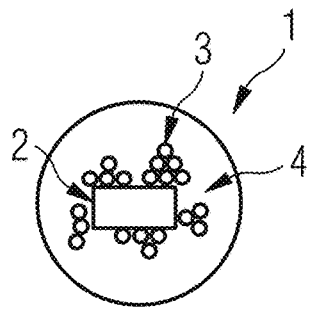
Figure 4B:
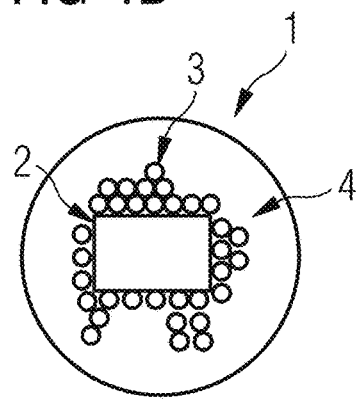

The structures 1 according to FIGS. 4A and 4B differ from the structure according to FIG. 1 in that each second nanoparticle 3 is in direct contact to at least one of the first nanoparticle 2 and a further second nanoparticles 3.

The first nanoparticle 2 and the second nanoparticles 3 form an assembly. Optionally, the assembly may be encapsulated with an encapsulation 4. The surface of the first nanoparticle 2 may be partially (FIG. 4A) or completely (FIG. 4B) covered with the second nanoparticles 3. In other words, the second nanoparticles 3 form a layer around the first nanoparticle 2. The layer of second nanoparticles 3 may have a thickness of between and including 1 nm and 100 nm, for example, between and including 1 nm and 20 nm or between and including 1 nm and 10 nm.

Figure 5A:
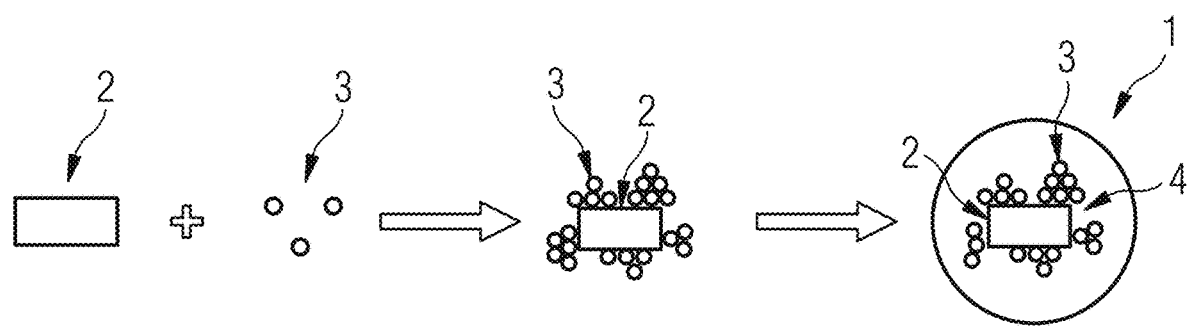
Figure 5B:
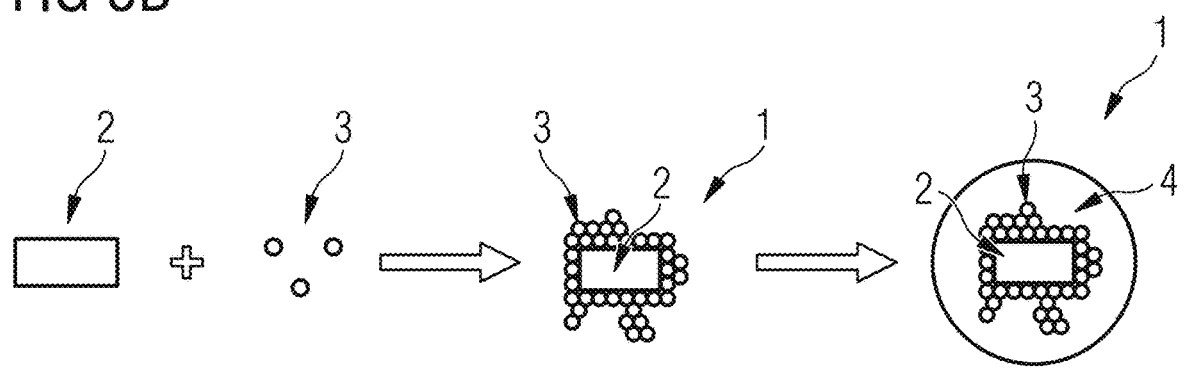

The structures 1 according to FIGS. 4A and 4B may be produced according to FIGS. 5A and 5B by forming an assembly of the first nanoparticle 2 and the second nanoparticles 3 and optionally encapsulating the assembly with an encapsulation 4.

The assembly may be prepared in such a way that the second nanoparticles 3 are bonded to the first nanoparticle 2 by at least one of aggregating, noncovalent binding, covalent binding, and agglomerating. For example, the first nanoparticle 2 and the second nanoparticles 3 may be prepared in such a way that, accounting for bound and charged ligands, the nanoparticles 2, 3 are oppositely charged. The oppositely charged nanoparticles 2, 3 may be allowed to aggregate into structures 1. Alternatively, for attaining an even higher level of control, the first nanoparticle 2 and the second nanoparticles 3 may be covalently linked, for example, via organic ligands bound to a surface of the first nanoparticle 2 and the second nanoparticles 3 that chemically react with one another.

Figure 5C:
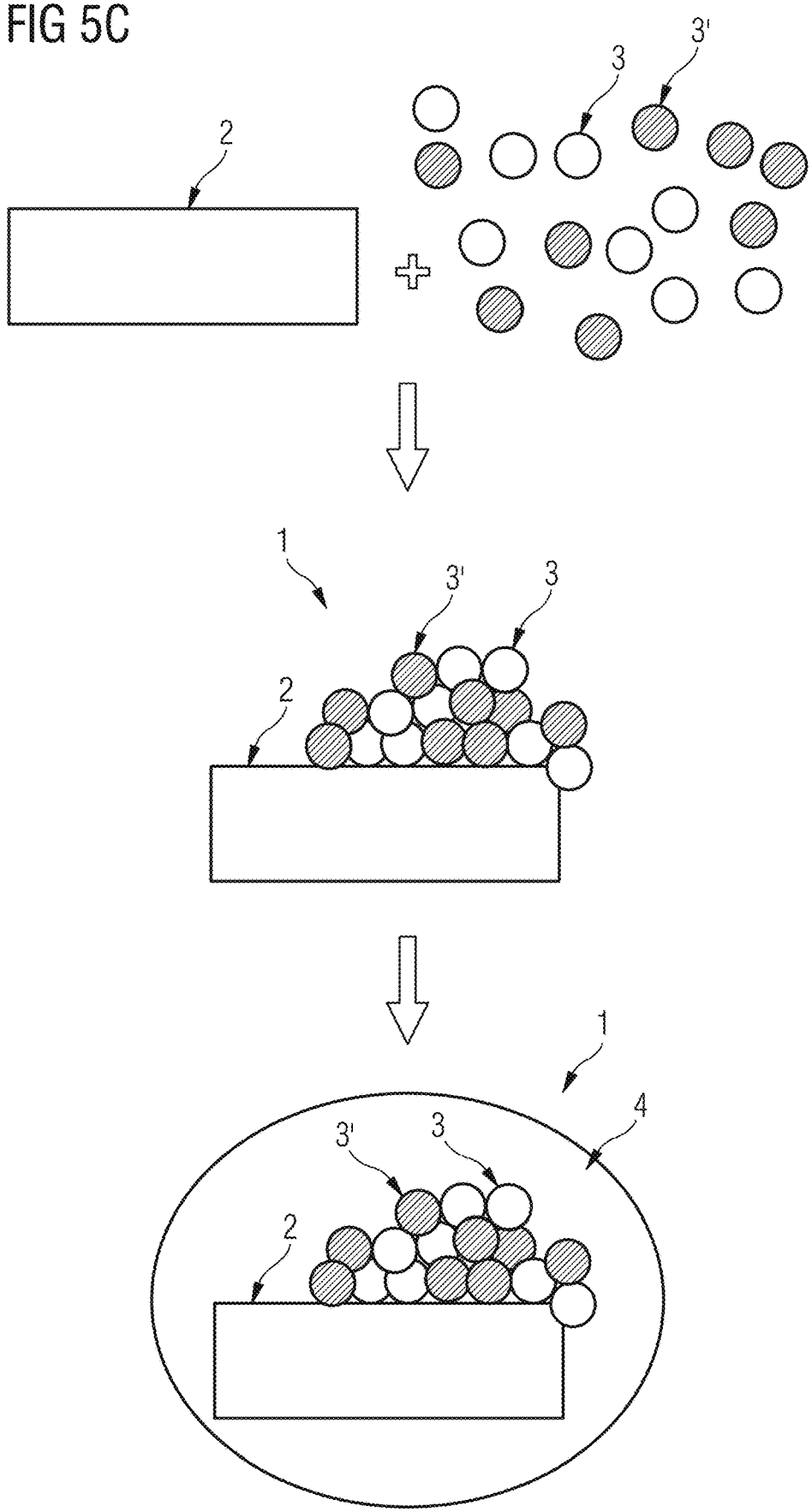

As shown in FIG. 5C, two different types of second nanoparticles 3, 3' may be provided for forming the assembly with the first nanoparticle 2. The two different types of second nanoparticles 3, 3' differ from one another in at least one of: size, composition, and shape. For example, the second nanoparticles 3 have a different composition then the second nanoparticles 3'. The structure 1 then comprises a mixed layer of the two types of second nanoparticles 3, 3' on the surface of the first nanoparticle 2.

Figure 6:
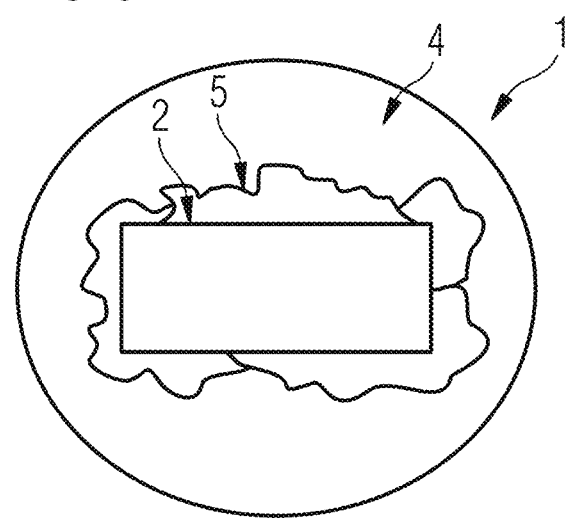

FIG. 6 shows a structure 1 that differs from the structure 1 according to FIGS. 4A and 4B in that the second nanoparticles 3 are partially melted or lightly sintered to the first nanoparticle 2. The partially melted or lightly sintered second nanoparticles 3 form a melted or sintered structure 5 surrounding the first nanoparticle 2 at least partially, or completely. The melted or sintered structure 5 may have the form of a layer surrounding the first nanoparticle 2 having a thickness of between and including 1 nm and 100 nm, for example, between and including 1 nm and 20 nm or between and including 1 nm and 10 nm.

Figure 7A:
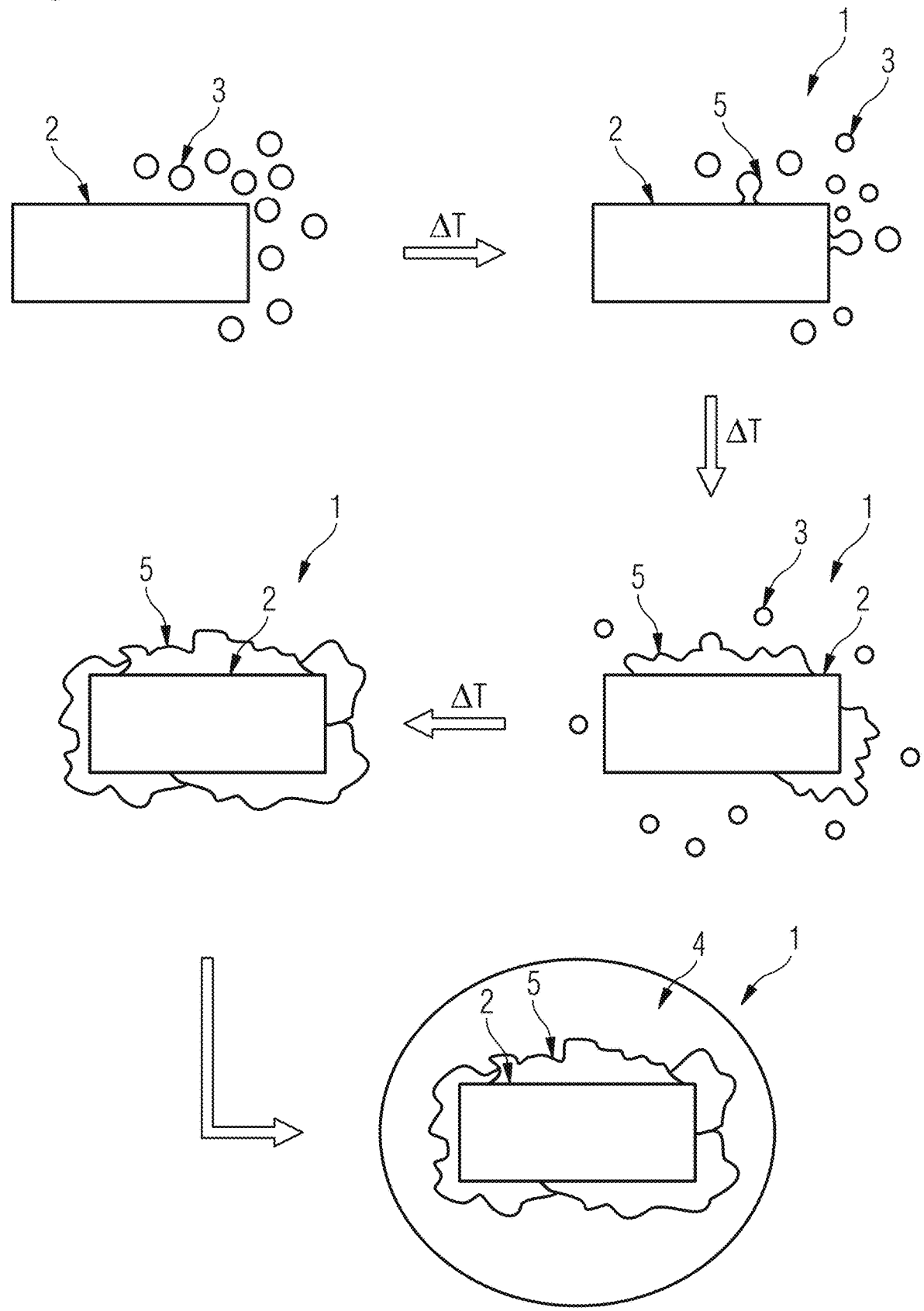

The structure according to FIG. 6 may be produced according to FIG. 7A by providing second nanoparticles 3 in proximity to a first nanoparticle 2. By applying a temperature, for example, of between and including 90° C. and 400° C., the second nanoparticles 3 are melted and/or sintered to the surface of the first nanoparticle 2 forming a melted or sintered structure 5. By further applying the temperature, multiple sintering events expand the coverage of the first nanoparticle 2 with the melted or sintered structure 5. In a further embodiment, the surface of the first nanoparticle 2 is completely covered by the melted or sintered structure 5.

Optionally, the first nanoparticle 2 and the second nanoparticles 3 may be co-encapsulated in an encapsulation 4 following various degrees of melting or sintering.

Figure 7B:
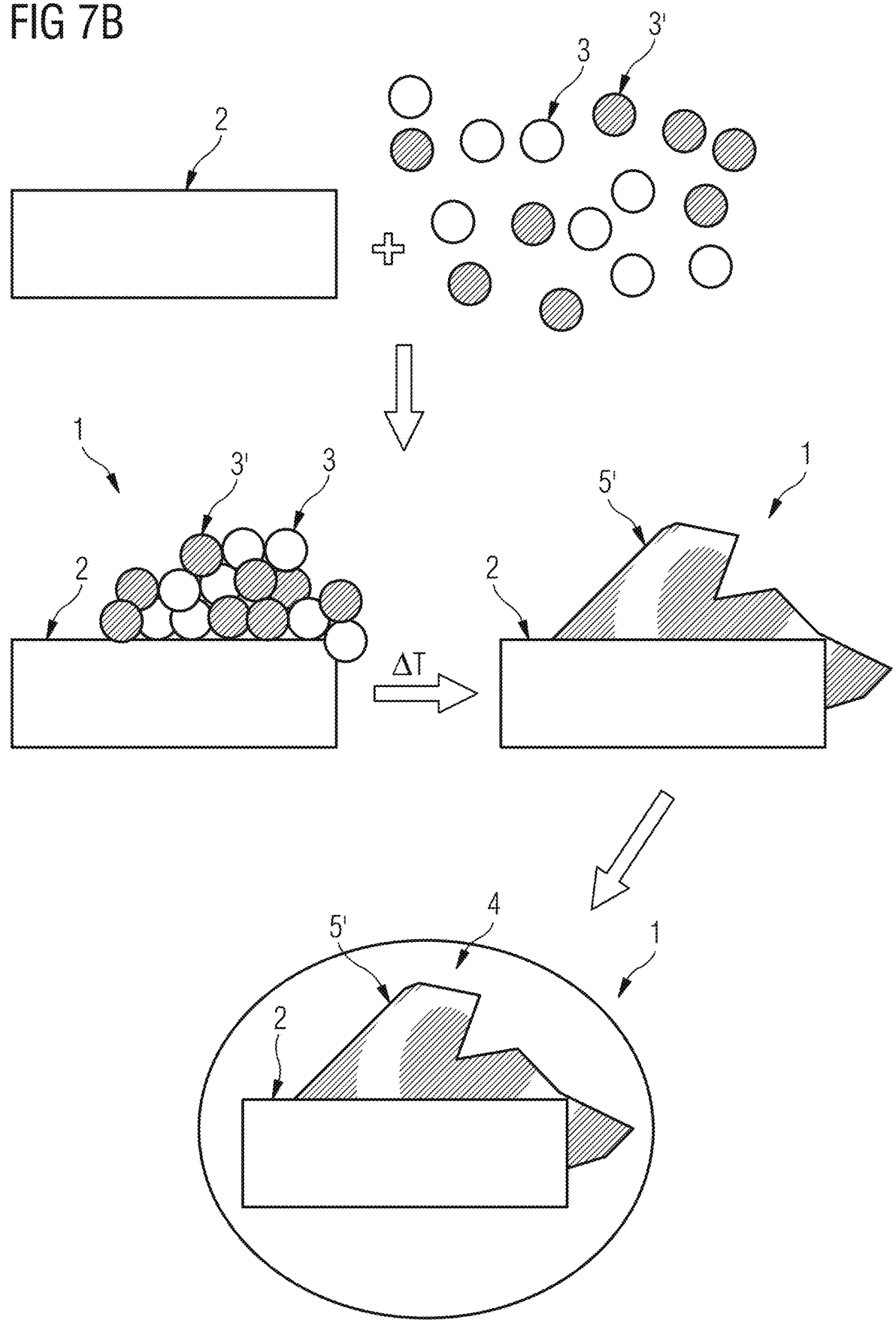

Instead of using one type of second nanoparticles 3, two different types of second nanoparticles 3, 3' may be provided and melted and/or sintered to the first nanoparticle 2 as shown in FIG. 7B forming a melted or sintered structure 5' on the surface of the first nanoparticle 2. The melted or sintered structure 5' is a mixed layer of both types of second nanoparticles 3, 3'.

Figure 8:
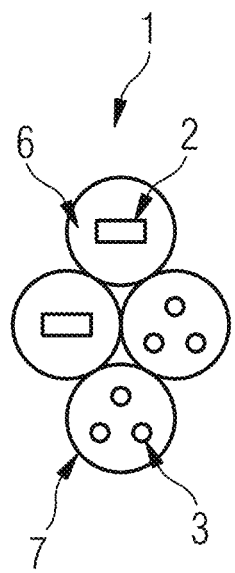

FIG. 8 shows a structure 1 comprising a first nanoparticle 2 encapsulated in a first encapsulation 6 and second nanoparticles 3 encapsulated in a second encapsulation 7. The first encapsulation 6 and the second encapsulation 7 are in direct contact and thus the first nanoparticle 2 and the second nanoparticles 3 are in close proximity. The first encapsulation 6 and the second encapsulation 7 may comprise the same encapsulation material, for example, silica.

Figure 9:
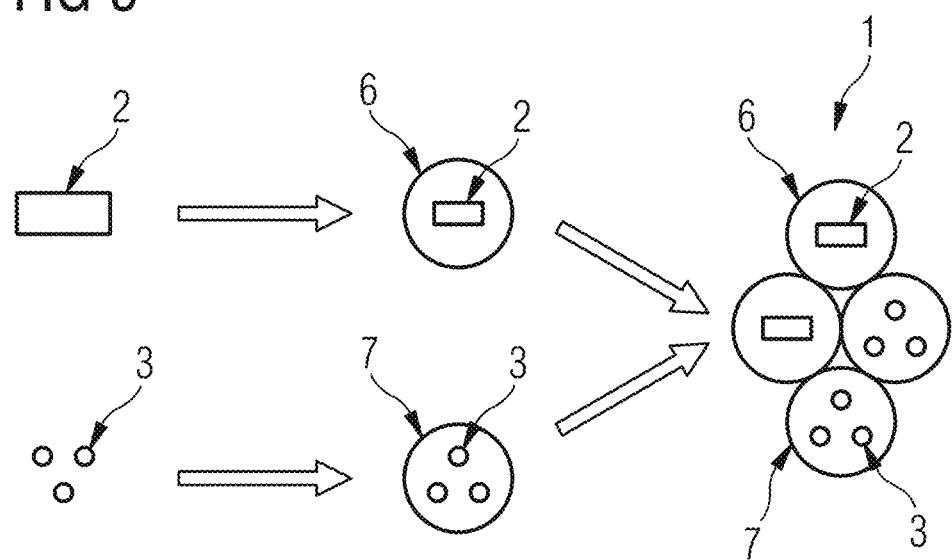

The structure 1 according to FIG. 8 may be produced according to FIG. 9 by encapsulating the first nanoparticle 2 in a first encapsulation 6, in particular homogeneously, and by encapsulating the second nanoparticles 3 in a second encapsulation 7, in particular homogeneously. Each second nanoparticle 3 may be individually encapsulated or a plurality of second nanoparticles 3 may be encapsulated together. The pre-encapsulated nanoparticles 2, 3 are then admixed and agglomerated or aggregated or fused to form the structure 1.

Figure 10:
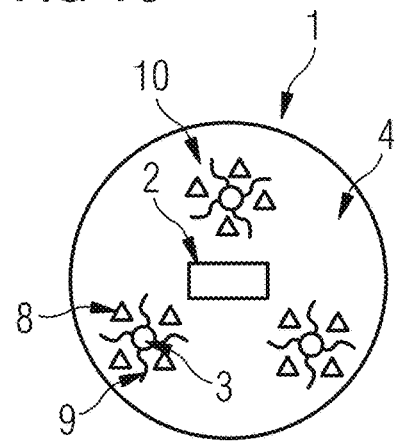

FIG. 10 shows a structure 1 with an intermediate structure 10 of second nanoparticles 3 comprising surface moieties 8, 9, wherein the first surface moiety 8 is bonded to the second nanoparticles 3 by a second surface moiety 9. The second surface moiety 9 may be a polymer or a molecular species with an affinity for binding the first surface moiety. The first surface moiety 8 may be an organic or an inorganic molecule or species. The first surface moiety 8 is, for example, poly-ethyleneglycol which, through its affinity for water, may enhance the moisture of the environment near the first nanoparticle 2. Alternatively, the first surface moiety 8 may be a reductant or an oxidant such as borans, borohydrides, citrates, oxalates, reducing sugars, aldehydes, or hydrazine iodide, sulfites, thiosulfates, and dithionates.

In the exemplary embodiment of FIG. 10, the second nanoparticles 3 themselves may be inactive meaning the second nanoparticles 3 have no interaction with the species likely to degrade the first nanoparticle 2. In this case, the second nanoparticles 3 are utilized more for their surface moiety carrying capacity. Alternatively, the second nanoparticles 3 may be active meaning the second nanoparticles 3 have an interaction with the species likely to degrade the first nanoparticle 2. In both cases, the nanoscale size of the second nanoparticles 3 provides a means to entrap the second nanoparticles 3 together with the surface moieties 8, 9 in the same vicinity as the first nanoparticle 2. This contrasts with ions or small molecules which may, more or less freely, diffuse through a surrounding media such as a silica encapsulation.

Figure 11:
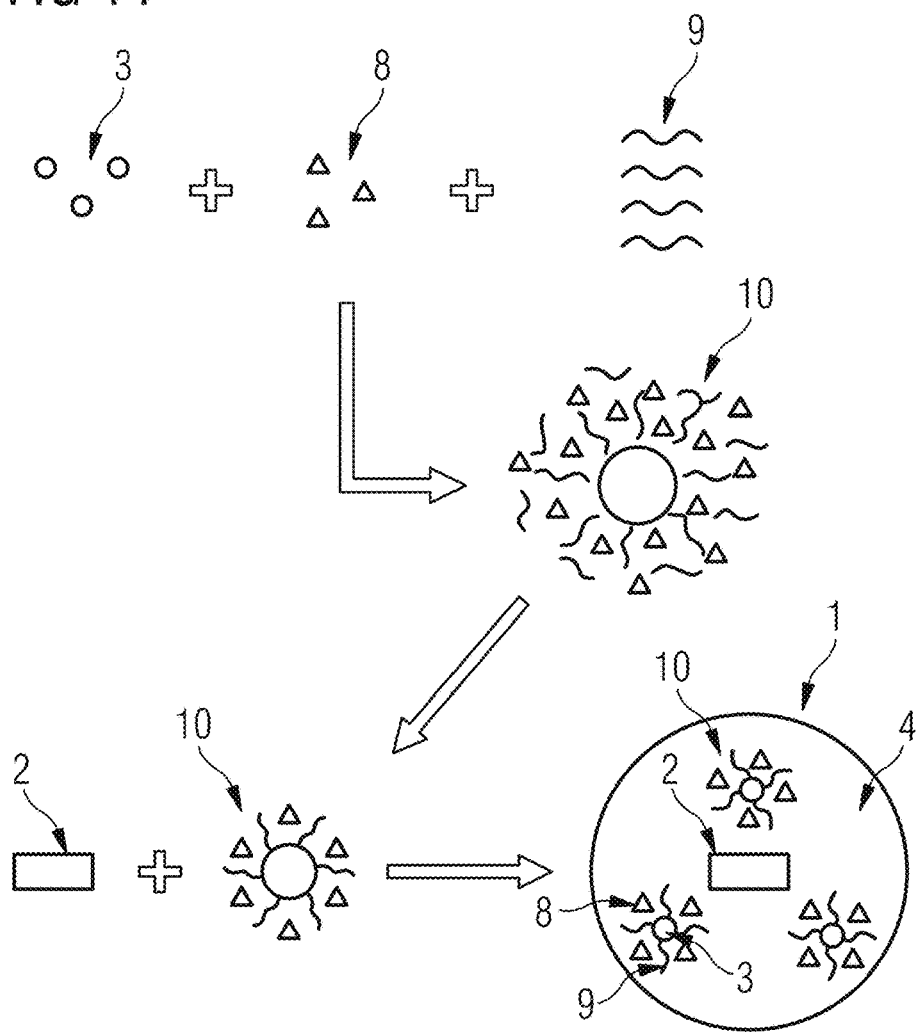

The structure 1 according to FIG. 10 may be produced according to FIG. 11 by preparing the intermediate structure 10 comprising second nanoparticles 3 decorated with the surface moieties 8, 9 by binding the second surface moiety 9 to the surface of the second nanoparticles 3 and by binding the first surface moiety 8 to the second surface moiety 9. Subsequently, the second nanoparticles 3 decorated with the surface moieties 8, 9 are arranged in close proximity to the first nanoparticle 2 and optionally encapsulated together with the first nanoparticle 2 in an encapsulation 4.

Figure 12:
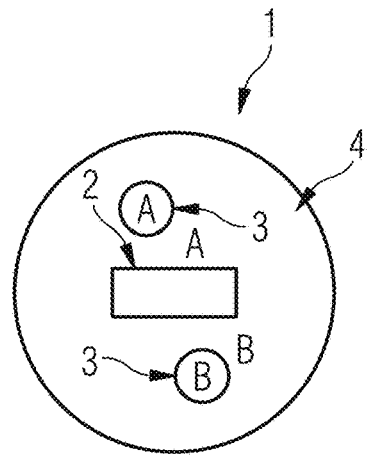

FIG. 12 shows a structure 1 in which at least one of the second nanoparticles 3 comprises an internal payload species A and at least one of the second nanoparticles 3 comprises a second internal payload species B. The first internal payload species A and the second internal payload species B differ from one another in at least one of: composition and charge number. The respective internal payload species A, B is internal to the second nanoparticles 3 rather than surface attached. In particular, the internal payload species A, B is substitutionally or interstitially incorporated into the lattices of the second nanoparticles 3. The internal payload species A, B includes, for example, copper(I), iron(II), mercury, and combinations thereof.

In the structure 1 of FIG. 12, the second nanoparticles 3 may act as a buffer that provides a stream of ions of the internal payload species A, B in the vicinity of the first nanoparticle 2. It should be noted that the internal payload species A, B provides its effect when released in proximity to the first nanoparticle and not when bonded on and/or in the second nanoparticles 3. In particular, the second nanoparticles 3 function as a carrier for bringing the internal payload species A, B in the vicinity of the first nanoparticle 2 functioning as a slow release drug.

Figure 13:
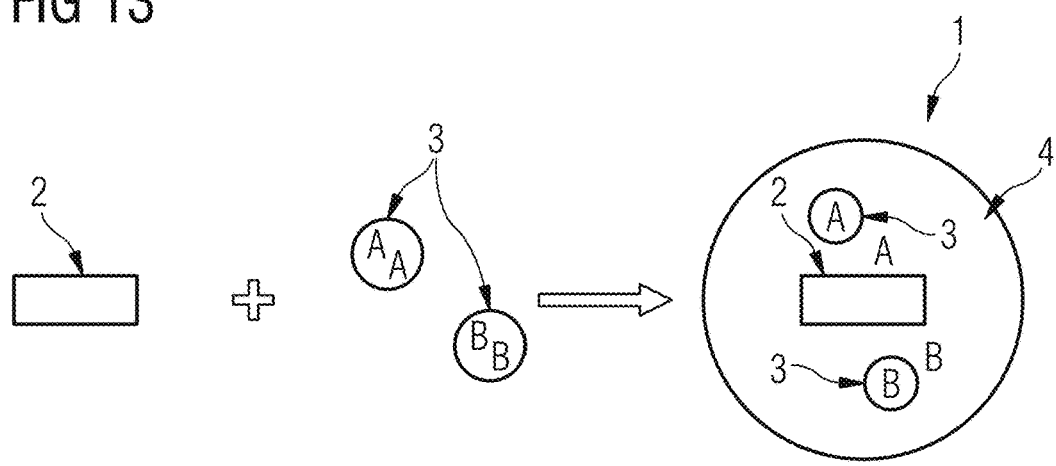
Figure 14:
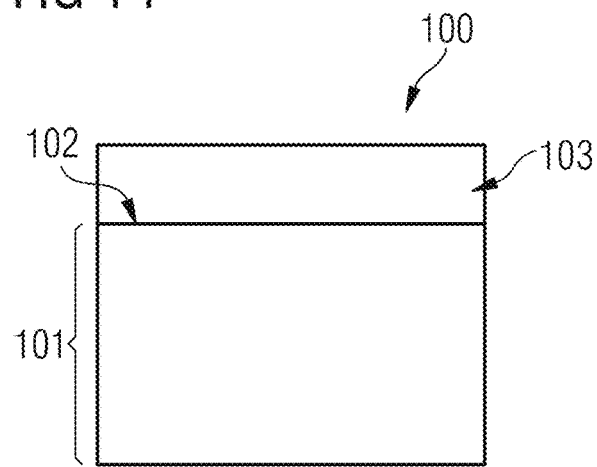
FIG. 14 shows a schematic illustration of an optoelectronic device according to an exemplary embodiment.

The structure 1 according to FIG. 12 may be produced according to FIG. 13 by admixing the first nanoparticle 2 and the second nanoparticles 3 comprising the internal payload species A, B prior to forming an encapsulation 4 around the nanoparticles 2, 3. During and after encapsulation, the second nanoparticles 3 provide the internal payload species A, B in proximity to the first nanoparticle 2.

FIG. 14 shows a schematic illustration of an optoelectronic device 100 comprising a semiconductor chip 101 with an active layer stack and an active region (not explicitly shown here). During operation, the semiconductor chip 101 emits a primary radiation, for example, from the radiation emission surface 102. In particular, the primary radiation is an electromagnetic radiation of the first wavelength range. For example, the semiconductor chip 101 emits electromagnetic radiation in the visible wavelength range, in particular in the blue wavelength range, for instance in a wavelength range between and including 400 nm and 490 nm such as 450 nm.

A conversion element 103 is arranged on the radiation emission surface 102 of the semiconductor chip 101. In particular, the conversion element is arranged in direct contact to the radiation emission surface 102. The conversion element 103 is configured or designed to absorb the primary radiation and convert at least a portion of the primary radiation into secondary radiation. The secondary radiation is an electromagnetic radiation with a wavelength range at least partially, or completely, different from the primary radiation. In particular, the secondary radiation is an electromagnetic radiation of the second wavelength range, for example, having wavelengths between and including 500 nm and 2000 nm, such as between and including 500 nm and 700 nm.

The conversion element 103 comprises or consists of at least one structure 1. For example, the conversion element 103 comprises at least one structure 1, in particular a plurality of structures 1, as shown in conjunction with FIGS. 1, 3, 4A, 4B, 6, 8, 10, and 12. In particular, the at least one structure 1 may be embedded in a matrix material such as silicone, polysiloxane or epoxy.

The features and exemplary embodiments described in connection with the figures may be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCES

1 structure
2 first nanoparticle
3, 3' second nanoparticle
4 encapsulation
5, 5' melted or sintered structure
6 first encapsulation
7 second encapsulation
8 first surface moiety
9 second surface moiety
10 intermediate structure
A first internal payload species
B second internal payload species
100 optoelectronic device
101 semiconductor chip
102 radiation emission surface
103 conversion element

What is claimed is:

1. A structure comprising:
a first nanoparticle comprising at least one semiconductor material, wherein the first nanoparticle is chromophoric in a first wavelength range and emissive in a second wavelength range and wherein the at least one semiconductor material is a III-V compound semiconductor material or a II-VI compound semiconductor material;
a plurality of second nanoparticles, wherein the second nanoparticles are non-chromophoric in the first wavelength range and in the second wavelength range; and
an encapsulation, wherein the first and second nanoparticles are co-encapsulated in the encapsulation, and wherein the first nanoparticle and the second nanoparticles are spaced apart within the encapsulation.

2. The structure according to claim 1,
wherein the first nanoparticle comprises a core and at least one shell.

3. The structure according to claim 1,
wherein the second nanoparticles comprise particles selected from the group consisting of metallo-particles, semiconductor particles, chalcogenide particles pnictide particles, and combinations thereof.

4. The structure according to claim 1,
wherein the second nanoparticles comprise at least one surface moiety.

5. The structure according to claim 4,
wherein the second nanoparticles comprise a first surface moiety and a second surface moiety, wherein the first surface moiety is bonded to the second nanoparticles by the second surface moiety.

6. The structure according to claim 1,
wherein the structure comprises at least one internal payload species in close proximity to the first nanoparticle.

7. The structure according to claim 6,
wherein the at least one internal payload species is internal to the second nanoparticles.

8. The structure according to claim 1,
wherein the first nanoparticle is encapsulated in a first encapsulation,
wherein the second nanoparticles are encapsulated in a second encapsulation, and
wherein the first encapsulation and the second encapsulation are in direct contact with each other.

9. The structure according to claim 8,
wherein the first encapsulation and the second encapsulation comprise the same encapsulation material.

10. An optoelectronic device comprising:
a semiconductor chip configured to emit a primary radiation; and
a conversion element configured to convert at least a portion of the primary radiation into a secondary radiation;
wherein the conversion element comprises at least one structure according to claim 1.

* * * * *